(12) United States Patent
Schindler et al.

(10) Patent No.: US 6,649,468 B2
(45) Date of Patent: Nov. 18, 2003

(54) METHOD FOR FABRICATING A MICROELECTRONIC COMPONENT

(75) Inventors: Günther Schindler, München (DE); Zvonimir Gabric, Zorneding (DE); Walter Hartner, Glen Allen, VA (US)

(73) Assignee: Infineon Technologies AG, Munich (DE)

(*) Notice: Subject to any disclaimer, the term of this patent is extended or adjusted under 35 U.S.C. 154(b) by 6 days.

(21) Appl. No.: 09/939,249

(22) Filed: Aug. 24, 2001

(65) Prior Publication Data

US 2002/0025592 A1 Feb. 28, 2002

(30) Foreign Application Priority Data

Aug. 24, 2000 (DE) .......................... 100 41 685

(51) Int. Cl.$^7$ .......................... H01L 21/8242
(52) U.S. Cl. .................. 438/253; 438/396; 438/3; 438/240; 438/241; 438/250; 257/295
(58) Field of Search ................ 438/239, 250, 438/253–256, 393, 394–396, 437, 686; 257/295, 296

(56) References Cited

U.S. PATENT DOCUMENTS

| | | |
|---|---|---|
| 5,624,864 A | 4/1997 | Arita et al. |
| 5,960,252 A | 9/1999 | Matsuki et al. |
| 6,066,868 A | 5/2000 | Evans, Jr. |
| 6,174,766 B1 * | 1/2001 | Hayashi et al. ............ 438/241 |
| 6,225,656 B1 * | 5/2001 | Cuchiaro et al. .......... 257/295 |

FOREIGN PATENT DOCUMENTS

| | | |
|---|---|---|
| DE | 199 04 379 A1 | 8/2000 |
| EP | 0 629 002 A1 | 12/1994 |
| EP | 0 642 167 A2 | 3/1995 |
| EP | 0 915 522 A2 | 5/1999 |
| EP | 0 954 031 A2 | 11/1999 |

* cited by examiner

*Primary Examiner*—Dung A Le
(74) *Attorney, Agent, or Firm*—Laurence A. Greenberg; Werner H. Stemer; Ralph E. Locher

(57) ABSTRACT

A method for fabricating a microelectronic component includes the step of applying a barrier against the passage of hydrogen to a storage capacitor having a ferroelectric dielectric or a paraelectric dielectric. During the formation of the barrier, firstly a silicon oxide layer is produced, the latter is then subjected to a heat treatment and a barrier layer is subsequently applied. A microelectronic component has a storage capacitor and a barrier including a silicon oxide layer and a barrier layer. The silicon oxide layer is disposed on an electrode of the storage capacitor and has been subjected to a heat treatment in an oxygen-containing atmosphere. The barrier layer is disposed on the silicon oxide layer and protects the storage capacitor against a passage of hydrogen through the barrier.

12 Claims, 3 Drawing Sheets

METHOD FOR FABRICATING A MICROELECTRONIC COMPONENT

BACKGROUND OF THE INVENTION

Field of the Invention

The invention relates to a method for fabricating a microelectronic component, in which a storage capacitor is formed on a substrate. A barrier, which affords protection against the passage of hydrogen is formed on the storage capacitor. The invention furthermore relates to a microelectronic component of this type.

Conventional microelectronic semiconductor memory components (DRAMs) essentially include a selection or switching transistor and a storage capacitor in which a dielectric material is inserted between two capacitor plates. Oxide or nitride layers having a relative permittivity of at most about are usually mostly used as a dielectric. In order to reduce the size of the storage capacitor and in order to fabricate non-volatile memories, "novel" capacitor materials (ferroelectrics or paraelectrics) with significantly higher relative permitivities are required. Examples of such materials are mentioned in the publication "Neue Dielektrika für Gbit-Speicherchips" [New dielectrics for Gbit memory chips] by W. Hönlein, Phys. Bl. 55 (1999). In order to fabricate ferroelectric capacitors for use in non-volatile semiconductor memory components having a high integration density, it is possible to use e.g. ferroelectric materials, such as $SrBi_2(Ta,Nb)_2O_9$ (SBT or SBTN), $Pb(Zr,Ti)O_3$ (PZT), or $Bi_4Ti_3C_{12}$ (BTO) as a dielectric between the capacitor plates. However, it is also possible to use a paraelectric material, such as $(Ba,Sr)TiO_3$ (BST), for example.

However, the use of these novel dielectrics presents the semiconductor process technology with new challenges. This is because, firstly, these novel materials can no longer be combined with polycrystalline silicon, the traditional electrode material. Therefore, it is necessary to use inert electrode materials such as, for example, platinum-group metals or their conductive oxides (e.g. $RuO_2$). The reason for this is that after the deposition of the ferroelectric, the latter has to be subjected to heat treatment ("conditioned") if appropriate a number of times in an oxygen-containing atmosphere at temperatures of about 550–800° C. In order to avoid undesirable chemical reactions between the ferroelectric and the electrodes, the latter are therefore mainly produced from platinum or another sufficiently thermostable and inert material, such as another platinum-group metal (Pd, Ir, Rh, Ru, Os).

For the integration of the storage capacitors, process steps are performed which take place in a hydrogen-containing environment. Thus, by way of example, the conditioning of the metallization and of the transistors requires a heat treatment in forming gas, which has a composition of 95% nitrogen ($N_2$) and 5% hydrogen ($H_2$). The penetration of hydrogen into the processed storage capacitor, i.e. into the dielectric, can, however, lead to degradation of the oxidic ceramics of the dielectric as a result of reduction reactions. Furthermore, the plasma-enhanced deposition (PECVD) of intermetal oxides or of the silicon nitride passivation layer can, on account of the high hydrogen content in the layers, cause reduction of the ferroelectric or paraelectric material of the dielectric. Hydrogen also appears during the deposition of electrically conductive materials, for instance refractory metals such as tungsten or titanium. The deposition serves, for example, to produce layers or to fill contact holes.

Furthermore, the penetration of hydrogen into the storage capacitor also adversely affects the structural properties. Thus, a peeling effect, for example, can occur.

It is already known to apply a silicon nitride layer to the storage capacitor as a barrier against the penetration of hydrogen. Silicon nitride is deposited, for example, according to the LPCVD (Low Pressure Chemical Vapor Deposition) process at about 750° C. The starting materials in the formation of silicon nitride are $SiH_2Cl_2$ and $NH_3$. During the deposition, however, hydrogen radicals are formed and the storage capacitor is thus damaged.

Furthermore, it is known to form hydrogen barriers made of materials, which can be deposited without hydrogen being present. Examples of such materials are $AlO_x$, $TiO_x$, $TiO_xN_y$. However, these oxidic materials are difficult to etch, with the result that, after the customary silicon oxide layer has been applied to the barrier, contact holes to the electrodes of the storage capacitors and/or through the barrier to the substrate material can be etched only in conjunction with a high outlay.

It has also already been proposed to omit the filling of contact holes with tungsten, which is done in the presence of hydrogen, and to use aluminum instead. Contemporary commercially available products with ferroelectric dielectrics are therefore embodied with aluminum as metallization material. However, a region to be filled can be filled significantly more reliably with tungsten than with aluminum. In any event, contemporary known methods for filling with aluminum must be dispensed with in the course of further miniaturization and further increasing of the storage densities of semiconductor memories.

SUMMARY OF THE INVENTION

It is accordingly an object of the invention to provide a microelectronic component and a method of producing a microelectronic component which overcome the above-mentioned disadvantages of the heretofore-known methods and components of this general type and which allow contact holes to be etched in a simple manner after the application of an effective hydrogen barrier. At the same time, there should not be any considerable damage to the storage capacitor as a result of the application of the hydrogen barrier.

With the foregoing and other objects in view there is provided, in accordance with the invention, a method for fabricating a microelectronic component, the method includes the steps of:

forming a storage capacitor on a substrate by providing a first electrode and a second electrode and by providing a dielectric selected from the group consisting of a ferroelectric dielectric and a paraelectric dielectric disposed between the first electrode and the second electrode; and forming a barrier by producing a silicon oxide layer on the storage capacitor, by subjecting the storage capacitor and at least part of the silicon oxide layer to a heat treatment, and by applying a barrier layer on the silicon oxide layer for protecting against a passage of hydrogen through the barrier.

An essential concept in the method according to the invention is that, during the barrier formation, firstly a silicon oxide layer is produced. The storage capacitor and at least part of the silicon oxide layer are subjected to heat treatment, i.e. are thermally treated in particular immediately after the deposition of the silicon oxide layer. By way of example, the storage capacitor and the silicon oxide layer are baked at a temperature of 500° C. or higher, preferably 650° C. or higher, in an oxygen atmosphere.

A barrier layer, which affords protection against the passage of hydrogen is applied to the heat-treated silicon oxide layer.

In particular if the electrodes of the storage capacitor contain platinum or a platinum-group metal, the silicon oxide layer takes from the platinum or platinum-group metal the catalytic activity, i.e. drastically reduces or substantially eliminates the catalytic activity, which, in the presence of hydrogen, can lead to particularly severe damage to the storage capacitor. Therefore, subsequent process steps in which hydrogen is present lead only to slight or even no damage to the storage capacitor. Therefore, the silicon oxide layer is preferably applied directly to the electrode material.

The heat treatment or the baking of the storage capacitor and at least part of the silicon oxide layer has the effect that hydrogen which, during the application of the silicon oxide layer, has penetrated into the vicinity of the storage capacitor or has penetrated into the latter is removed again. The heat treatment advantageously takes place in an oxygen-containing atmosphere, so that the oxygen bonds with the hydrogen (water molecule formation). The heat treatment already leads to the required conditioning of the dielectric before the application of the hydrogen barrier layer.

Preferably, at least part of the silicon oxide layer is deposited in a low temperature process, in particular a PECVD (Plasma Enhanced Chemical Vapor Deposition) process. In this case, the temperature is about 350° C., for example. An essential advantage of the low temperature process is that the hydrogen present does not lead to permanent damage to the storage capacitor. As a result of the subsequent heat treatment, preferably at significantly higher temperatures, penetration of hydrogen into the storage capacitor is reversible. Moreover, at the low temperature, the chemical reactions between the hydrogen and the dielectric material, which can proceed at high temperatures do not take place.

The silicon oxide layer is generally densified by the heat treatment, in particular if the heat treatment is effected at a higher temperature than the deposition. This already provides a partial protection against the passage of hydrogen.

Finally, the heat treatment of the silicon oxide layer has a favorable effect on its behavior during the further method steps, since the silicon oxide layer is already exposed, during the heat treatment, to the temperatures, which generally lead to a structural change. Such structural changes are undesirable, for example, during the subsequent application of the barrier layer because they can have an unfavorable effect on the structure and the adhesion behavior of the barrier layer. The same applies correspondingly to materials that are subsequently applied to the barrier layer, for instance an insulation layer, which embeds the storage capacitor and the barrier.

Preferably, a partial layer of the silicon oxide layer which is applied to a partial layer that has already been applied is deposited in a high temperature process, in particular an HTO (High Temperature Oxide) process. On account of the high temperature, it is possible to produce silicon oxide with a high density without subsequent heat treatment of the partial layer. Nevertheless, it is preferred also to carry out a heat treatment after the application of this partial layer, in order to anneal any damage due to penetrated hydrogen of the storage capacitor and/or to bake out penetrated hydrogen.

The invention makes it possible to use tungsten for electrical contact-connection, in particular for filling contact holes, which are introduced into the abovementioned insulation layer and the barrier, since the capacitor can be effectively protected against penetration of hydrogen by the barrier. Consequently, further miniaturization is possible and higher storage densities can be achieved in microelectronic memory modules.

Preferably, at least part of the barrier layer is applied to the heat-treated silicon oxide layer in a hydrogen-free deposition process. In this case, the thickness of the part of the barrier layer can be kept so small that, in the case of materials that are inherently difficult to etch, such as metal oxides, the barrier layer can be etched with a tenable outlay. If such a partial layer of the barrier layer is applied, then a further partial layer can be applied in the presence of hydrogen, since the previously applied part of the barrier layer already protects the storage capacitor from the hydrogen.

If at least parts of the barrier layer are applied or deposited in the presence of hydrogen, then a heat treatment of the storage capacitor, of the silicon oxide layer and of the already applied part of the barrier layer is preferably carried out afterward. What is applicable to the heat treatment before the application of the barrier layer is correspondingly applicable to this.

In a preferred embodiment, a partial layer of the barrier layer, which, however, is not the partial layer applied first, is composed of silicon nitride or a silicon nitride layer is applied. In this case, the previously applied at least one partial layer of the barrier layer acts as a buffer for the hydrogen which is present during the application of the silicon nitride layer. Depending on the material of the previously applied partial layer, the latter is a barrier and/or a store for hydrogen. Examples of materials, which store hydrogen are titanium and most of its compounds.

Suitable materials for the barrier layer are, in particular, Ti, TiN, $TiO_x$ (for example reactively sputtered or oxidized from Ti at e.g. 700° C., for 5 minutes in an oxygen atmosphere), Ta, TaN, $TaO_x$ (e.g. reactively sputtered or oxidized from Ta at e.g. 700° C., for 5 minutes in an oxygen atmosphere), $AlO_x$, $NbO_x$, $ZrO_x$ and/or $Si_xN_y$.

In particular, a barrier layer or partial layer made of $Si_xN_y$ can be deposited in an LPCVD (Low Pressure Chemical Vapor Deposition) process at about 600–750° C., preferably 660° C., and a pressure of 30 Pa. Furthermore, an $Si_xN_y$ layer can be deposited in an LP (Low Pressure) microwave process in which at least one $Si_xN_y$ precursor is activated by microwave radiation. In this way, it is possible to avoid the $NH_3$, which is present in the LPCVD process and is a starting material for the formation of hydrogen.

The SiN layer can also be fabricated by sputtering, thereby likewise avoiding the occurrence of $H_2$ during the deposition.

By forming the silicon oxide layer in the form of two or more than two partial layers, the partial layers being applied in different fabrication processes and therefore having a different oxide structure, it is possible, as described above, largely to avoid damage to the storage capacitor. As a result, moreover, it is possible to form a good foundation for applying the actual barrier layer and to reduce the catalytic effect of platinum or platinum-group metal present in an outer electrode of the storage capacitor.

With the objects of the invention in view there is also provided, a microelectronic component, including:
a substrate;
a storage capacitor formed on the substrate;
the storage capacitor including a first electrode, a second electrode and a dielectric selected from the group consisting of a ferroelectric dielectric and a paraelectric dielectric, the dielectric being disposed between the first electrode and the second electrode; and a barrier including a silicon oxide layer and a barrier layer, the silicon oxide layer being disposed on one of the first and second electrodes and having been subjected to a heat treatment in an oxygen-containing atmosphere, the barrier layer being disposed on the silicon oxide layer and protecting the storage capacitor against a passage of hydrogen through the barrier.

The barrier layer preferably has two partial layers made of different material. In particular, the partial layer located nearer the silicon oxide layer is made of a metal-oxide-containing material and has a layer thickness of 50 nm or less, preferably approximately 20 nm. Appropriate metals for the metal oxides are, in addition to the metals already mentioned, all transition metals. As an alternative, nitrides of the transition metals are appropriate as material for a partial layer of the barrier layer or for the barrier layer in its entirety. In particular, the partial layer located further away from the silicon oxide layer is a silicon nitride layer preferably having a layer thickness of approximately 25 nm.

According to another feature of the invention, an insulation layer is disposed on the barrier such that the storage capacitor and the barrier are embedded in the insulation layer.

According to yet another feature of the invention, the insulation layer has a contact hole formed therein, and a tungsten contact fills the contact hole and electrically contacts one of the first and second electrodes.

According to a further feature of the invention, the silicon oxide layer has two heat-treated partial layers with different oxide structures.

According to another feature of the invention, the barrier layer has two partial layers made of different materials.

According to yet another feature of the invention, a first one of the two partial layers is located closer to the silicon oxide layer than a second one of the two partial layers, and the first one of the two partial layers is composed of a metal-oxide-containing material and has a layer thickness of at most 50 nm, preferably of substantially 20 nm.

According to another feature of the invention, a second one of the two partial layers is located further away from the silicon oxide layer than a first one of the two partial layers, and the second one of the two partial layers is a silicon nitride layer.

Other features which are considered as characteristic for the invention are set forth in the appended claims.

Although the invention is illustrated and described herein as embodied in a microelectronic component and a method for fabricating a microelectronic component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
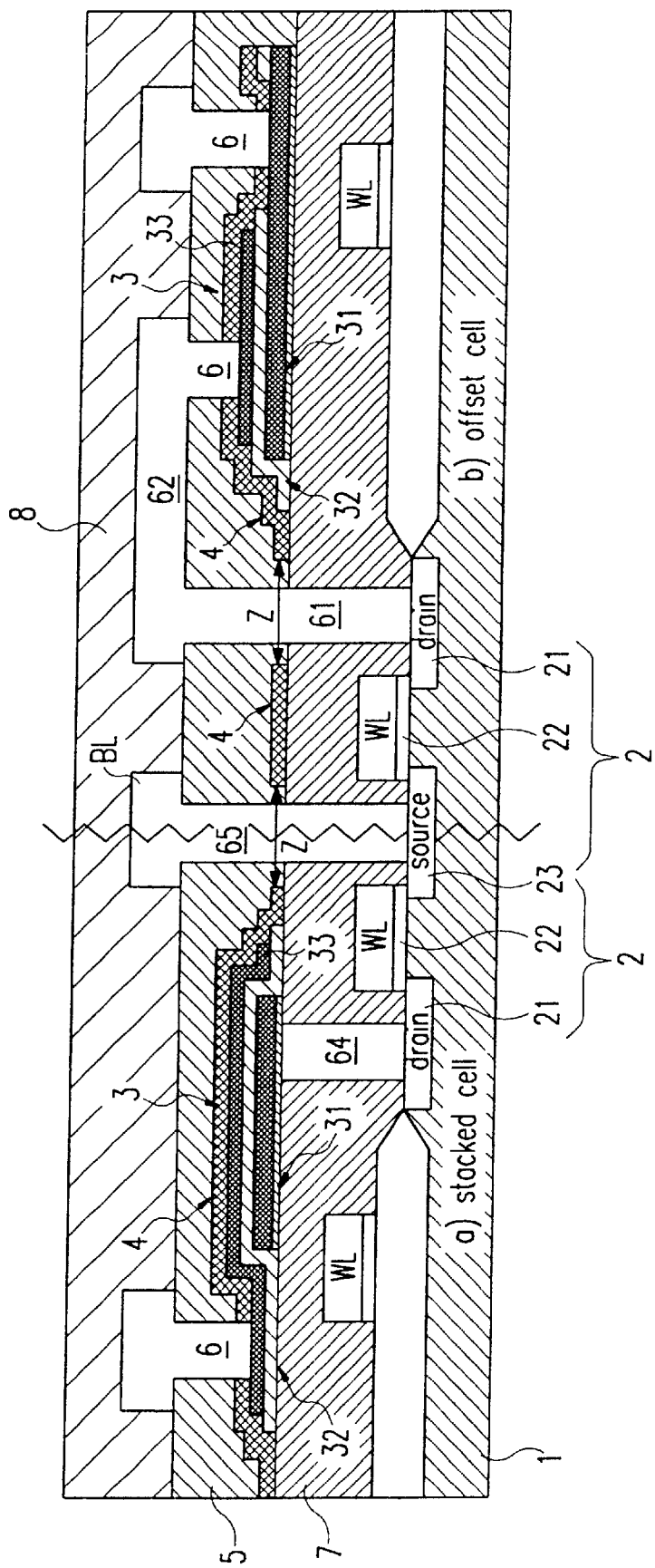
FIG. 1 is a cross-sectional view of a DRAM memory cell according to the invention in accordance with the stacked cell construction and a DRAM memory cell according to the invention in accordance with the offset cell construction.

Referring now to the figures of the drawings in detail and first, particularly, to FIG. 1 thereof, there is shown a stacked cell memory cell in the left-hand part of the figure and an offset cell memory cell is illustrated in the right-hand part of the figure, on a common semiconductor substrate 1. The jagged line approximately in the center of the figure indicates that in practice the two different memory cells are usually not provided on the same semiconductor substrate.

A source region 23, which is common to both memory cells is provided on the semiconductor substrate 1. Furthermore, a respective drain region 21 is provided. A respective gate 22 is situated between drain and source, with the result that a MOS transistor 2 is formed for each of the two memory cells, the transistor serving as a selection transistor. The gate 22 is in each case electrically connected to a word line WL. The word lines WL and the MOS transistors 2 are embedded in a first insulation layer 7, which is composed of $SiO_2$, for example.

The drain region 21 of the stacked cell memory cell illustrated in the left-hand part of the figure is connected via a tungsten-filled contact hole 64 to a first electrode 31 of a storage capacitor 3, the electrode being provided above the first insulation layer 7. A dielectric 32 made of a ferroelectric material or made of a paraelectric material having a relative permitivity of more than 8 is applied to the first electrode 31. A second electrode 33 is in turn applied to the dielectric 32, with the result that the first and second electrodes 31, 33 with the dielectric 32 lying in between form the storage capacitor 3.

With regard to the basic construction of the storage capacitor 3, the same is applicable in the case of the offset cell memory cell illustrated in the right-hand part of the figure. The offset cell and the stacked cell differ, however, with regard to the extent of the capacitor layers 31, 32, 33 along the surface of the first insulation layer 7 and with regard to the electrical contact-connection of the electrodes 31, 33. In the stacked cell, the electrode 31 is contact-connected from below, as already described. In the offset cell, by contrast, the first electrode 31 is contact-connected from above in a region in which neither the dielectric 32 nor the second electrode 33 extend above the first electrode 31. For this purpose, a contact hole 6 has been etched through a second insulation layer 5, which embeds the storage capacitor 3, and has been filled with tungsten. The second electrode 33 is contact-connected from above in both cell types, in each case through a contact hole 6 in the second insulation layer 5. In the offset cell (right-hand part of the figure), the second electrode 33 is furthermore electrically connected to the drain region 21 via an electrical connection 62, which extends along the surface of the second insulation layer 5, and via a tungsten-filled contact hole 61 through the first and second insulation layers 5, 7. A further contact hole 65 extends, proceeding from the source region 23, through the first and second insulation layers 5, 7 as far as the surface of the second insulation layer 5 to a bit line BL.

Consequently, including its electrical contact-connection and including the MOS transistor 2, the offset cell occupies a significantly larger structural volume. By contrast, the stacked cell imposes more stringent requirements with regard to precision and outlay during its production.

In both memory cell types, a layer-like barrier 4 is applied to the second electrode 33 and is intended to protect the storage capacitor 3 against penetration of hydrogen. In particular, the dielectrics 32 of the storage capacitors 3 are composed of one of the hydrogen-sensitive materials already mentioned.

In the case of the memory cells illustrated in FIG. 1, firstly the dielectric layer was patterned and then the barrier 4 was applied. In order to facilitate subsequent etching of the contact holes 61, 65, the barrier 4 was patterned in such a way that in the regions of the subsequent contact holes 61, 65 there is in each case an opening having a width Z, which is larger than the width of the contact hole 61, 65. After the patterning of the barrier 4, the second insulation layer 5 was applied. Afterward, the contact holes 6, 61, 65 were etched and metallized. Finally, a covering layer 8 was additionally applied to the surface of the second insulation layer 5 and to the metallization layer.

Figure 2:
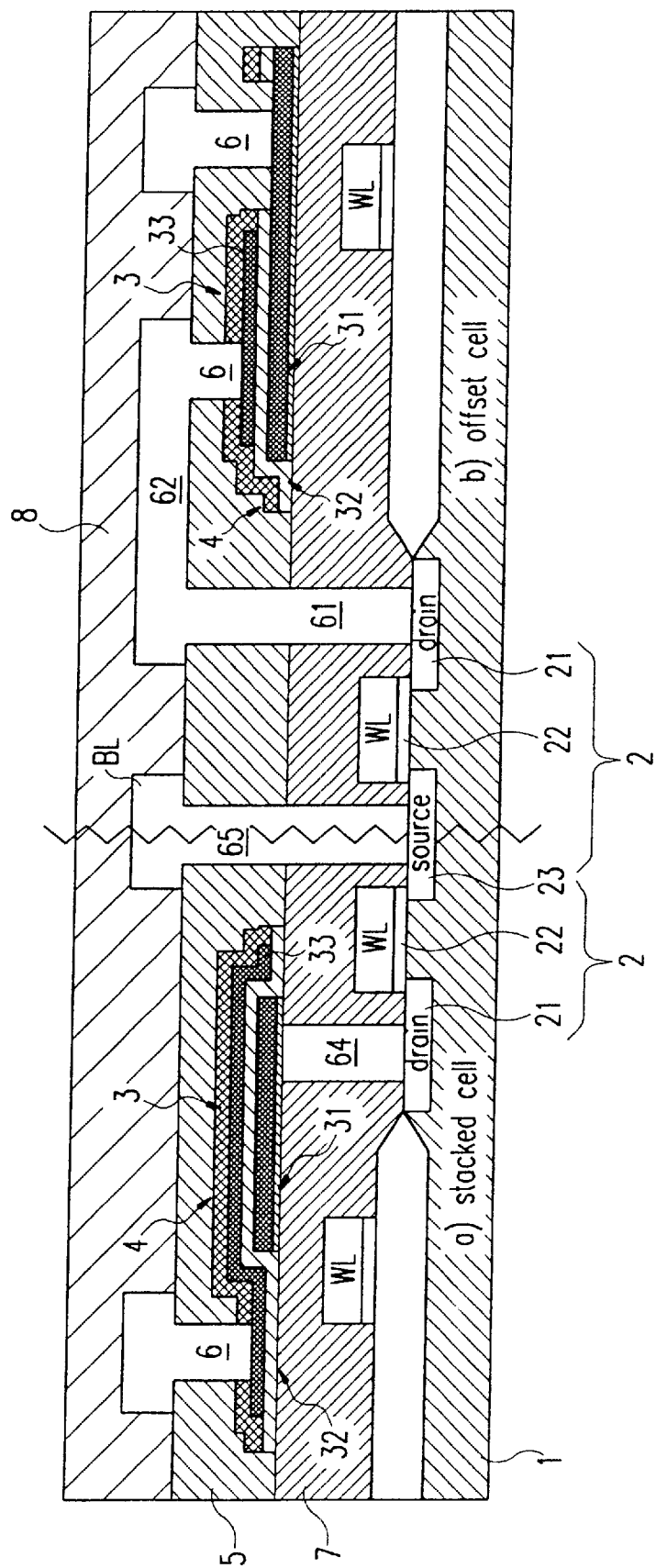
FIG. 2 is a cross-sectional view of two further memory cells of this type.

FIG. 2 likewise illustrates a respective memory cell of the stacked cell type and of the offset cell type. These two memory cells differ with regard to the patterning of the barrier 4 from the memory cells illustrated in FIG. 1. In this case, the barrier 4 and the dielectric 32 were patterned together, in particular using the same or similar masks. This means, on the one hand, that the fabrication process is simplified, but, on the other hand, has the effect that the edges of the dielectric layer are not covered by the barrier 4. In the case of the offset cell according to FIG. 2, it is advantageous that the barrier 4 is not in contact with the first electrode 31. Therefore, without restriction, electrically conductive materials can also be used for the barrier 4. If such materials are also intended to be used in the barrier 4 of the offset cell according to FIG. 1, particular measures are necessary, for example structural changes, or a partial layer of the barrier 4 that is applied first must be composed of electrically insulating material.

Exemplary embodiments of a barrier against the passage of hydrogen, as are present in the memory cells illustrated in FIG. 1 and FIG. 2, will now be explained in more detail with reference to FIG. 3 and FIG. 4.

Figure 3:
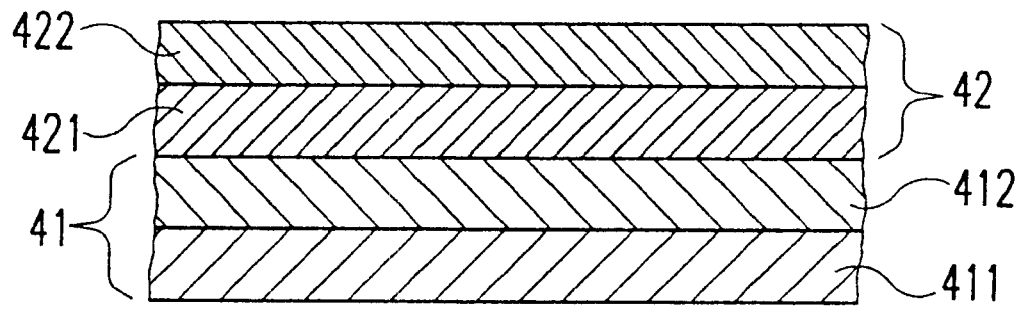
FIG. 3 is a cross-sectional view of the layer construction of a hydrogen barrier in accordance with a first embodiment of the invention.

FIG. 3 shows a four-layer construction with a silicon dioxide layer 41, including a lower partial layer 411 and an upper partial layer 412, and with a barrier layer 42, including a lower partial layer 421 and an upper partial layer 422. The lower partial layer 411 of the silicon dioxide layer 41 is applied, for example, directly to the second electrode 33 of the storage capacitors 3 illustrated in FIG. 1 and FIG. 2, to be precise as a TEOS (tetraethylene orthosilicate) oxide in a PECVD (Plasma Enhanced Chemical Vapor Deposition) process, a plasma being ignited and the reaction to form $SiO_2$ thus being excited.

After the application of the first partial layer 411, the storage capacitor together with the first partial layer 411 is subjected to a heat treatment, preferably at a temperature of 700° C., for 30 minutes in an oxygen atmosphere at atmospheric pressure. This leads to the annealing of the, in particular, ceramic dielectric, to the driving out of the hydrogen which has penetrated into the storage capacitor during the fabrication of the first partial layer 411, and to the densification and thus to the preparation of the lower partial layer 411 for the further method steps. As an alternative, the heat treatment can also be effected in a shorter time and at other temperatures. Good results can primarily be achieved when the temperature of the storage capacitor and of the lower partial layer 411 during the heat treatment is 500° C. for at least 5 minutes.

After the heat treatment, the upper partial layer 412 is deposited directly on the surface of the first partial layer 411 in an HTO (High Temperature Oxide) process using the starting gases $SiH_4$ and $N_2O$ at approximately 700° C. and a pressure of 40 Pa. Afterward, the entire silicon dioxide layer 41 and the storage capacitor are again subjected to a heat treatment, in particular under the same conditions as immediately after the application of the lower partial layer 411.

Applying the silicon dioxide layer 41 in a plurality of steps means that, on the one hand, damage to the storage capacitor is prevented or damage is annealed by heat treatment and, on the other hand, a high-quality silicon dioxide layer is applied. The temperature is comparatively low during the application of the lower partial layer 411, with the result that the storage capacitor is only slightly damaged.

The edge coverage and coverage of the margins of the underlying capacitor layers 32, 33 which is required, in particular, for the memory cells illustrated in FIG. 1 and FIG. 2 is still not satisfactory as a result of the application of the lower partial layer 411. However, even as early as the high-temperature process in which the upper partial layer 412 is applied, the lower partial layer 411 prevents more extensive damage to the storage capacitor, in particular on account of shielding of the hydrogen present and in that the catalytic effect of the platinum or platinum-group metal possibly present in the electrodes 31, 33 is reduced. The upper partial layer 412 deposited in the high temperature process has a very good edge coverage and margin coverage of underlying layers.

After the second heat treatment, the lower partial layer 421 of the barrier layer 42 is applied directly to the upper partial layer 412 of the silicon dioxide layer 41. The requisite deposition processes are known per se and depend on the respective material of the lower partial layer 421. The latter may be composed of $ZrO_x$, TiN, Ti or $AlO_x$, for example. After the application of the lower partial layer 421, heat treatment can again be effected.

The upper partial layer 422 of the barrier layer 42 is applied directly to the lower partial layer 421. The material of the upper partial layer 422 is preferably $Si_3N_4$ which is deposited in an LPCVD (Low Pressure Chemical Vapor Deposition) process at approximately 750° C. and a pressure of 30 Pa or in a PECVD process. The $Si_3N_4$ deposited in this process has an outstanding barrier effect against the passage of hydrogen and itself contains practically no hydrogen. However, since the hydrogen-containing gases $SiH_2Cl_2$ ($SiH_4$) and $NH_3$ are used during the fabrication of the $Si_3N_4$ layer, the previous application of the lower partial layer 421 has an advantageous effect and protects the storage capacitor from irreversible damage. The lower partial layer 421 can be fabricated in a hydrogen-free deposition process and be composed, in particular, of one of the metal oxides that are generally difficult to etch. However, since the lower partial layer 421 of the barrier layer 42 does not yet have to have the complete barrier effect of the entire barrier layer 42, the lower partial layer 421 can have a comparatively small layer thickness of about 20 nm, for example, with the result that the layer can be etched with a tenable outlay. The layer thicknesses of the other partial layers are, for example, about: 25 nm in the case of the lower partial layer 411 of the silicon dioxide layer 41, 25 nm in the case of the upper partial layer 412 of the silicon dioxide layer 41 and 25 nm in the case of the upper partial layer 422 of the barrier layer 42.

Figure 4:
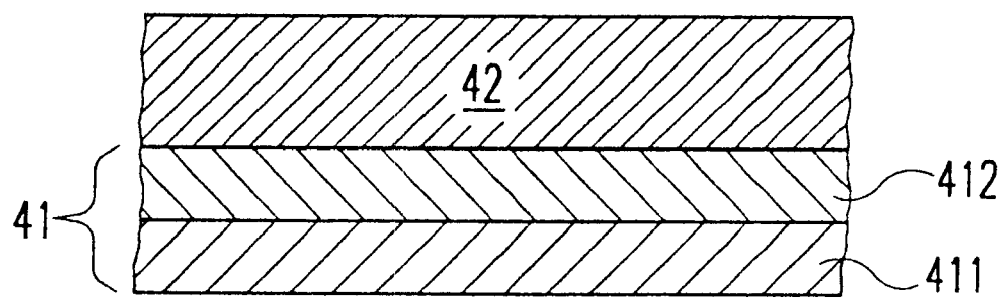
FIG. 4 is a cross-sectional view of a hydrogen barrier in accordance with a second embodiment of the invention.

A further exemplary embodiment of a barrier against the passage of hydrogen is illustrated in FIG. 4. In this case, the lower partial layer 411 and the upper partial layer 412 of the silicon dioxide layer 41 are fabricated and subjected to heat treatment in particular in the same way as the corresponding layers of the exemplary embodiment according to FIG. 3. However, the barrier layer 42 according to FIG. 4 is composed of one material and is preferably applied in a continuous process. In order to exhibit a good barrier effect, a layer thickness of the barrier layer 42 of 50 to 100 nm is preferred. It is further preferred for the material chosen to be an easily etchable material, in particular TiN, TaN or another nitride of transition metals. LPCVD-SIN, PECVD-SIN, $HO_x$ or $ZrO_x$ is likewise conceivable as material for the barrier layer 42.

The invention is not restricted to the exemplary embodiments that have been described in more detail with reference to the figures. Rather, by way of example, the silicon oxide layer may be a single layer produced in a continuous method step and/or the heat treatment of a plurality of partial layers can be effected only after the application of the partial layers. However, the heat treatment always leads to an improvement in the properties of a storage capacitor.

We claim:

1. A method for fabricating a microelectronic component, the method which comprises:

forming a storage capacitor on a substrate by providing a first electrode and a second electrode and by providing a dielectric selected from the group consisting of a ferroelectric dielectric and a paraelectric dielectric disposed between the first electrode and the second electrode;

forming a barrier by producing a silicon oxide layer on the storage capacitor, by subjecting the storage capacitor and at least part of the silicon oxide layer to a heat treatment, and by applying a barrier layer on the silicon oxide layer for protecting against a passage of hydrogen through the barrier; and forming the barrier layer from a plurality of partial layers each protecting against the passage of hydrogen, including:
applying a first one of the partial layers;
subsequently applying a silicon nitride layer as a second one of the partial layers; and
depositing the silicon nitride layer with a low pressure microwave process and activating at least one silicon nitride precursor with microwave radiation during the low pressure microwave process.

2. The method according to claim 1, which comprises applying at least part of the barrier layer in a hydrogen-free deposition process.

3. The method according to claim 1, which comprises subjecting at least part of the barrier layer to a heat treatment subsequent to applying the barrier layer.

4. The method according to claim 1, which comprises forming the silicon oxide layer from a plurality of partial layers.

5. The method according to claim 4, which comprises depositing a first one of the partial layers with a low-temperature process.

6. The method according to claim 4, which comprises depositing a first one of the partial layers with a Plasma Enhanced Chemical Vapor Deposition process.

7. The method according to claim 1, which comprises carrying out the heat treatment of the storage capacitor and of the silicon oxide layer in an oxygen-containing atmosphere at temperatures of at least 500° C.

8. The method according to claim 1, which comprises carrying out the heat treatment of the storage capacitor and of the silicon oxide layer in an oxygen-containing atmosphere at temperatures of at least 650° C.

9. A method for fabricating a microelectronic component, the method which comprises:

forming a storage capacitor on a substrate by providing a first electrode and a second electrode and by providing a dielectric selected from the group consisting of a ferroelectric dielectric and a paraelectric dielectric disposed between the first electrode and the second electrode;

forming a barrier by producing a silicon oxide layer on the storage capacitor, by subjecting the storage capacitor and at least part of the silicon oxide layer to a heat treatment, and by applying a barrier layer on the silicon oxide layer for protecting against a passage of hydrogen through the barrier; and forming the silicon oxide layer from a plurality of partial layers, including:
depositing a first one of the partial layers with a low-temperature process; and
depositing a subsequent one of the partial layers with a high-temperature process.

10. A method for fabricating a microelectronic component, the method which comprises:

forming a storage capacitor on a substrate by providing a first electrode and a second electrode and by providing a dielectric selected from the group consisting of a ferroelectric dielectric and a paraelectric dielectric disposed between the first electrode and the second electrode;

forming a barrier by producing a silicon oxide layer on the storage capacitor, by subjecting the storage capacitor and at least part of the silicon oxide layer to a heat treatment, and by applying a barrier layer on the silicon oxide layer for protecting against a passage of hydrogen through the barrier; and forming the silicon oxide layer from a plurality of partial layers, including:
depositing a first one of the partial layers with a low-temperature process; and
depositing a subsequent one of the partial layers with a High Temperature Oxide process.

11. A method for fabricating a microelectronic component, the method which comprises:

forming a storage capacitor on a substrate by providing a first electrode and a second electrode and by providing a dielectric selected from the group consisting of a ferroelectric dielectric and a paraelectric dielectric disposed between the first electrode and the second electrode;

forming a barrier by producing a silicon oxide layer on the storage capacitor, by subjecting the storage capacitor and at least part of the silicon oxide layer to a heat treatment, and by applying a barrier layer on the silicon oxide layer for protecting against a passage of hydrogen through the barrier;

forming the silicon oxide layer from a plurality of partial layers; and carrying out the heat treatment of the storage capacitor subsequent to an application of one of the partial layers of the silicon oxide layer.

12. A method for fabricating a microelectronic component, the method which comprises:

forming a storage capacitor on a substrate by providing a first electrode and a second electrode and by providing a dielectric selected from the group consisting of a ferroelectric dielectric and a paraelectric dielectric disposed between the first electrode and the second electrode;

forming a barrier by producing a silicon oxide layer on the storage capacitor, by subjecting the storage capacitor and at least part of the silicon oxide layer to a heat treatment, and by applying a barrier layer on the silicon oxide layer for protecting against a passage of hydrogen through the barrier;

forming the silicon oxide layer from a plurality of partial layers; and carrying out the heat treatment of the storage capacitor by performing a heat treatment subsequent to each application of a respective one of the partial layers of the silicon oxide layer.

* * * * *